United States Patent

Shintani et al.

[11] Patent Number: 5,298,977
[45] Date of Patent: Mar. 29, 1994

[54] VISUAL INSPECTION METHOD FOR PART MOUNTED ON PRINTED CIRCUIT BOARD

[75] Inventors: Keiji Shintani; Hiroo Uchiyama, both of Yokohama, Japan

[73] Assignee: Matsushita Electric Industrial Co., Ltd., Osaka, Japan

[21] Appl. No.: 957,369

[22] Filed: Oct. 7, 1992

[30] Foreign Application Priority Data

Oct. 16, 1991 [JP] Japan .................. 3-267397

[51] Int. Cl.$^5$ .............................. G01B 11/00
[52] U.S. Cl. ........................ 356/376; 356/1; 356/9; 356/375; 356/381
[58] Field of Search ............ 356/1, 4, 372, 375, 356/381, 3, 9, 10; 250/201.6

[56] References Cited

U.S. PATENT DOCUMENTS

| | | | |
|---|---|---|---|
| 3,180,205 | 4/1965 | Heppe et al. | 356/375 |
| 3,187,185 | 6/1965 | Milnes | 356/381 |
| 3,796,492 | 3/1974 | Cullen et al. | 356/1 |
| 4,888,490 | 12/1989 | Bass et al. | 356/375 |

FOREIGN PATENT DOCUMENTS 2-216407  8/1990  Japan .

Primary Examiner—Richard A. Rosenberger
Attorney, Agent, or Firm—Stevens, Davis, Miller & Mosher

[57] ABSTRACT

Three different color light beams which are converged to a single light spot on the surface of a circuit board at predetermined incident angles, are irradiated onto the top surface of an electronic part mounted on the circuit board, then distances between the positions of the top surface of the electronic part to which the light beams are irradiated respectively, from the single light spot on the surface of the circuit board are measured, and the height and an inclined angle of the top surface of the electronic part are computed in accordance with the relationship between the measured distances and the incident angles.

6 Claims, 6 Drawing Sheets

VISUAL INSPECTION METHOD FOR PART MOUNTED ON PRINTED CIRCUIT BOARD

The present invention relates to a method of visually inspecting an electronic part or the like mounted on a printed circuit board so as to check a positional deviation thereof, a loose connection of a lead wire, inferior soldering or the like.

DESCRIPTION OF THE RELATED ART

Figure 7:
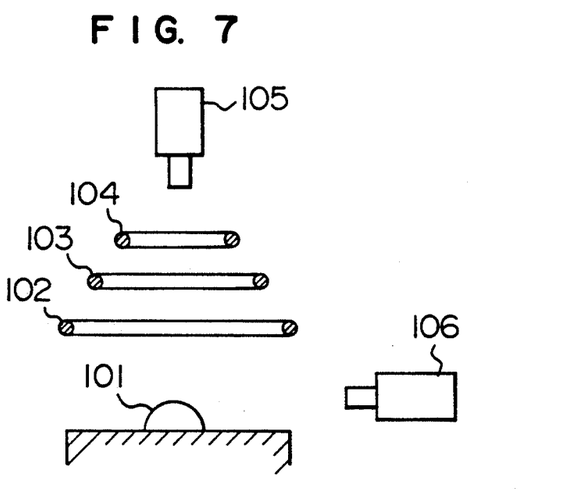
FIG. 7 is a schematic view illustrating an arrangement with which a circuit board visual inspection method of related art is carried out.

Japanese Patent Unexamined Publication No. 2-216407 discloses a method of visually inspecting a printed circuit board on which electronic parts are mounted. In this method, as shown in FIG. 7, red light, green light and blue light are emitted to an electronic part on the circuit board from a circular light sources 102, 103 and 104, and light reflected from the electronic part 101 is received by a first image pick-up device 10 or a second image pick-up device. Then, the reflected color light patterns detected thereby are compared with reflected color patterns which can be obtained if the electronic part is properly mounted on the printed circuit board and which have been beforehand stored in memory as reference patterns, thereby whether the part 101 is properly mounted on the printed circuit board or not is determined. However, the above-mentioned visual inspection method for an electronic part on the circuit board offers such a disadvantage that a precise quantitative inspection cannot be made since only a qualitative determination can be made in relative comparison of the detected reflected color light patterns with the stored reference color patterns for the electronic part which is mounted properly on the printed circuit board. Further, three kinds of circular light sources are required, and further, the first and second image pick-up devices are required in order to detect light reflected in various directions since the light is irradiated to various positions on the circuit board with various incident angles. Thus, the above-mentioned method offers, as a whole, a disadvantage in that an inspection apparatus used in the method costs a higher expense.

SUMMARY OF THE INVENTION

The present invention is devised in order to eliminate the above-mentioned disadvantages inherent to the related art, and accordingly, one object of the present invention is to provide a method of inspecting a circuit board mounted thereon with electronic parts and the like, in which light sources for emitting respectively three different color lights are arranged so that the light beams are converged to a single spot on the surface of the circuit board in order to quantitatively detect the height and inclined angle of an electronic part mounted on the circuit board and to detect a configuration of a mirror surface of the electronic part or the like.

According to the first aspect of the present invention, three light sources for emitting different color light beams, respectively, are arranged along one straight line so that the three color lights are converged to a single light spot on the surface of a circuit board to be inspected with respective predetermined incident angles, and these light beams are spotted onto an electronic part or the like mounted on the circuit board.

According to the second aspect of the present invention, three light sources for emitting respectively different color light beams are arranged at the apices of a triangle so that the three color light beams are converged to a single light spot on the surface of a circuit board to be inspected at respective predetermined incident angles, and then these light beams are spotted on an electronic part or the like mounted on the circuit board.

According to the third aspect of the present invention, three light sources for emitting respectively different color light beams are arranged along one straight line so that the color light beams are converged to a single straight line spot on the surface of a circuit board to be inpected, with respective predetermined incident angles, and then these light beams are irradiated onto an electronic part mounted on the circuit board so as to obtain three straight-line spots thereon. An optical system including a cylindrical lens or the like is suitably used for converging each of the light beams to the straight line spot or a slit-like spot.

According to the fourth aspect of the present invention, three different color light beams are irradiated onto a mirror surface part such as a soldered part or the like of an electronic part mounted on a circuit board to be inspected, with respective predetermined incident angles, and then reflected light obtained thereby is detected above the circuit board.

Thus, with the first aspect of the present invention, different color light beams from the three light sources arranged along a straight line, are spotted onto an electronic part mounted on the circuit board to be inspected, so that the dispositions of the light spots are measured with respect to the single light sport on the surface of the circuit board in order to know the height and inclined angle of the electronic part.

Further, with the second aspect of the present invention, three different color light beams from three light sources arranged at the apices of a triangle are spotted on an electronic part mounted on the circuit board to be inspected, so that the dispositions of the light spots are measured in order to know the height and inclined angle of the electronic part.

With the third aspect of the present invention, different color light beams from three light sources which are arranged along a straight line are converted into a slit-like shape by means of, for example, optical systems each including a cylindrical lens, and are then irradiated onto an electronic part mounted on a circuit board. Thereby it is possible to know the height and inclined angle of the electronic part from displacements of the slit-like or line light spots from the reference slit-like spot obtained on the surface of the circuit board.

Further, with the fourth aspect of the present invention, three different color light beams are irradiated onto a mirror surface of a part of an electronic part mounted on a circuit board to be inspected, with predetermined incident angles, and at least either one of mirror-surface reflection light beams obtained thereby is detected above the circuit board, thereby it is possible to know the configuration of the mirror surface of the part.

Other features and advantages will become apparent from the following description of the preferred embodiments when read with reference to the accompanying drawings.

DETAILED DESCRIPTION OF PREFERRED EMBODIMENTS

With reference to FIGs. 1a to 1d and FIGS. 2a to 2d, a method of detecting a height and an inclined angle of an electronic part mounted on a circuit board to be inspected in a first embodiment of the present invention will be hereinbelow explained. A red laser light source 1 for emitting a red laser beam 2, a green laser light source 3 for emitting a green laser beam 4 and a blue laser light source 5 for emitting a blue laser beam 6 are arranged along one straight line. The green laser beam 4 is irradiated onto the surface of a printed circuit board 7, perpendicular thereto, the red and blue laser beams 2, 6 are irradiated onto the surface of the printed circuit board 7 at an equal incident angle $\phi$ with respect to the green laser beam 4. These laser beams are converged to a single spot on the surface of the printed circuit board 7. A color TV camera 8 for detecting scattered light given by irradiation of the leaser beams is located above the printed circuit board 7. An electronic part 9 is mounted on the upper surface of the printed circuit board 7. The condition in which three laser beams are converged to a single spot which is visualized by scattered light therefrom that can be detected by the camera 8 is shown by reference numeral 10 in FIG. 1c. When the red, green and blue laser beams are irradiated on the top surface of the electronic part 9, the scattered light therefrom is detected as light spots 11, 12, 13 by the camera 8.

Figure 1A:
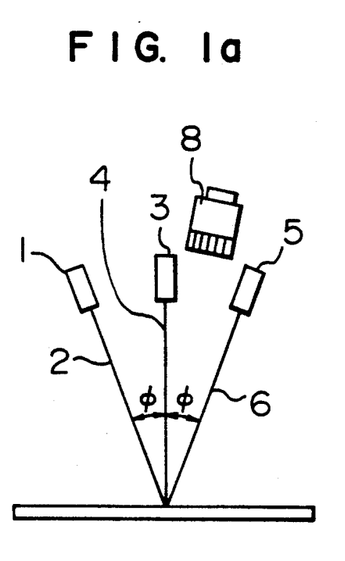
FIG. 1a is a schematic view illustrating an arrangement with which a circuit board visual inspection method in a first embodiment of the present invention is carried out.
Figure 1B:
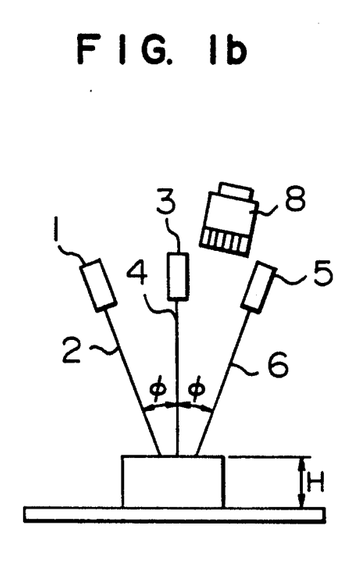
FIG. 1b is an explanatory view showing detection of a height of an electronic part mounted on a circuit board in the first embodiment.
Figure 1C:
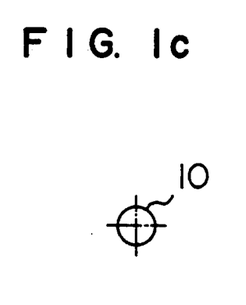
FIG. 1c is an explanatory view showing a condition of scattered light in the first embodiment.
Figure 1D:
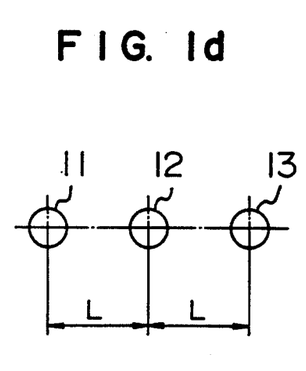
FIG. 1d is an explanatory view showing a condition of scattered light in the first embodiment.

Next, explanation will be hereinbelow made of the detection method in the first embodiment of the present invention. As shown in FIG. 1a, when the three different color laser beams are converged to a single spot on the surface of the printed circuit board 7, the scatted light having white color is reflected from the single spot as shown in FIG. 1c. However, when they are irradiated on to the top surface of the electronic part 9, three scattered light spots separated from each other are obtained due to a difference in height between the surface of the circuit board 7 and the top surface of the electronic part 9. The relationship between the distance L therebetween and the height H of the electronic part 9 is given by the following formula:

$$H = \frac{L}{\tan \phi}$$

By using the above-mentioned formula, the height of the electronic part 9 can be obtained by the measured distance L between the three light spots 11, 12, 13.

Figure 2A:
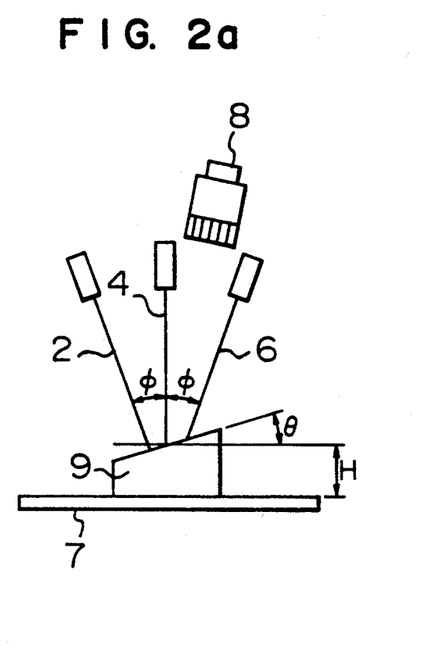
FIG. 2a is an explanatory view showing detection of an inclined angle of the electronic part in the first embodiment.
Figure 2B:
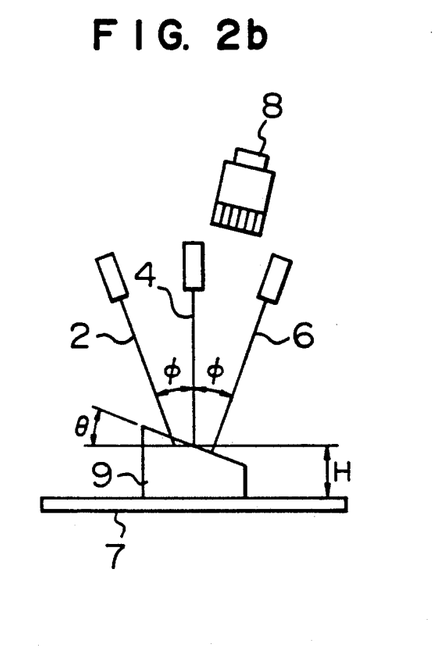
FIG. 2b is an explanatory view showing detection of an inclined angle of the electronic part in the first embodiment.
Figure 2C:
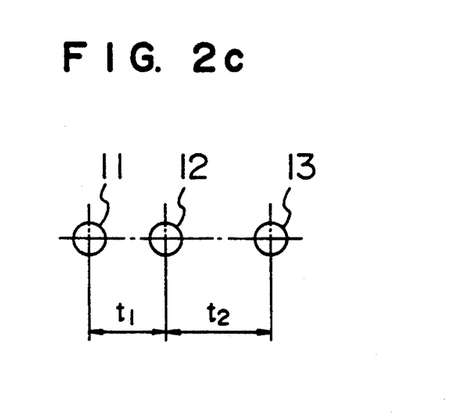
FIG. 2c is an explanatory view showing a condition of scattered light in the first embodiment.
Figure 2D:
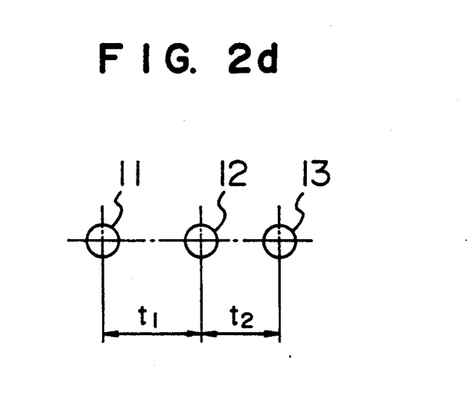
FIG. 2d is an explanatory view showing a condition of scattered light in the first embodiment.

In the case of inclination of the top surface of the electronic part 9 with respect to the surface of the printed circuit board 7, as shown in FIGS. 2a and 2b, the light spots 11, 13 are shifted by $t_1$, $t_2$ with respect to the light spots 12 given by the green laser beam 4. The relationship among the inclined angle of the top surface of the electronic part 9 and the shift values $t_1$, $t_2$ is given by teh following formula:

$$H = \frac{L}{\tan \phi} = \frac{2 \times t_1 \times t_2}{(t_1 + t_2) \tan \phi}$$

Further, the height of the electronic part 9 is given by the following formula:

$$\theta = \tan^{-1} \left[ \frac{t_2 - t_1}{(t_1 + t_2) \tan \phi} \right]$$

Thus, in the above-mentioned embodiments, scattered light form the light spots 11, 12, 13 given by the red, green and blue laser beams 4, 6, 8 irradiated onto the top surface of the electronic part 9 is picked up by the color TV camera 8 so that the image recognition is made for these spots 11, 12, 13 in order to compute the height of the electronic part 9 and the inclination of the irradiated surface thereof.

Figure 3A:
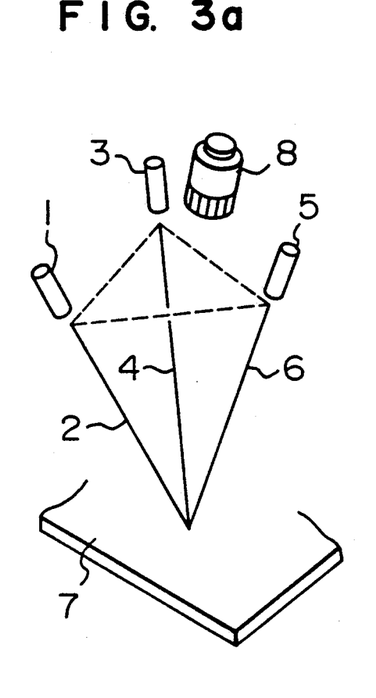
FIG. 3a is a schematic view illustrating an arrangement with which a circuit board visual inspection method in a second embodiment of the present invention is carried out.

Next, explanation will be made of a second embodiment of the present invention with reference to FIGS. 3a to 3d and FIGS. 4a to 4d. In these figures, like reference numerals are used to denote like parts shown in the figures used in the explanation of the first embodiment, and accordingly, detailed description thereof will be abbreviated. As shown in FIG. 3a, a red laser light source 1, a green laser light source 3 and a blue laser light source 5 are located at the apices of a triangle. Laser beams emitted from the laser light sources are converged onto a single spot on the surface of the printed circuit board 7 with respective predetermined incident angles.

Figure 3B:
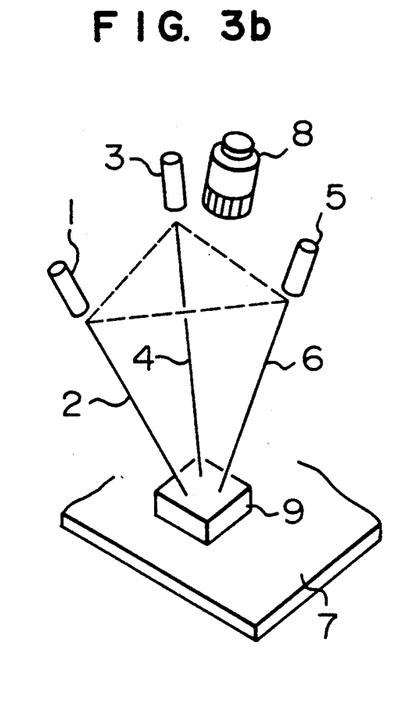
FIG. 3b is an explanatory view showing detection of a height of an electronic part mounted on a circuti board in the second embodiment.
Figure 3C:
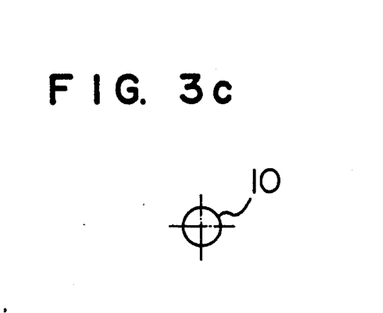
FIG. 3c is an explanatory view showing a condition of scattered light in the second embodiment.
Figure 3D:
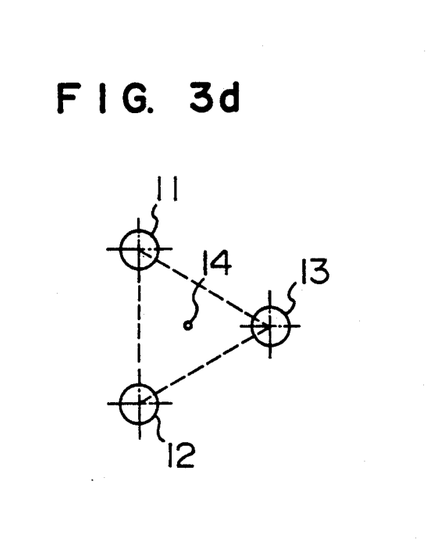
FIG. 3d is an explanatory view showing a condition of scattered light in the second embodiment.

Next, a detection method in the above-mentioned second embodiment will be hereinbelow explained. Sine the laser beams are converged to a single light spot on the surface of the printed circuit board 7, the single spot is visualized as a white light spot by scattered light therefrom, as shown in FIG. 3c. When the laser beams are irradiated on the top surface of an electronic part 9, light spots 11, 12, 13 are visualized on the top surface of the electronic part 9 by scattered light of the laser beams from the laser light sources, as shown in FIG. 3b. These light spots 11, 12, 13 are shifted to the apices of an triangle having, as a center point, the reference point 14 at which the single light spot 10 is positioned. If the top surface of the electronic part 9 is parallel with the printed circuit board 7, the distances from the reference point 14 to the light spots 11, 12, 13 are equal to each other. These distances and the height of the electronic have a predetermined relationship therebetween which given by the incident angles of the laser beams. With the use of this relationship, the height of the electronic part 9 can be calculated by detecting these distances from the reference point 14 to the light spots 11, 12, 13 with the use of a color camera 8.

Figure 4A:
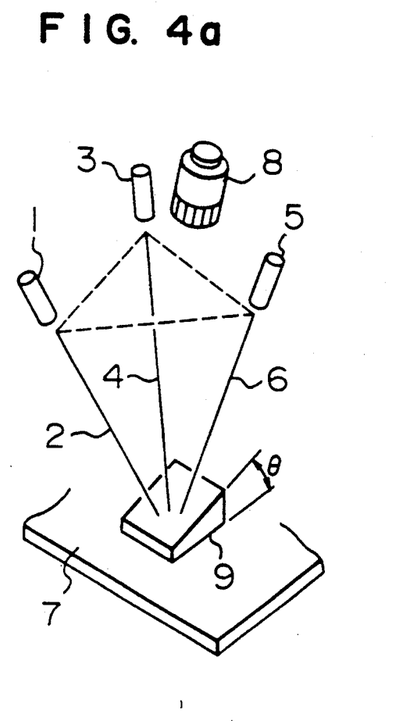
FIG. 4a is an explanatory view showing detection of an inclined angle of the electronic part in the second embodiment of the invention.
Figure 4B:
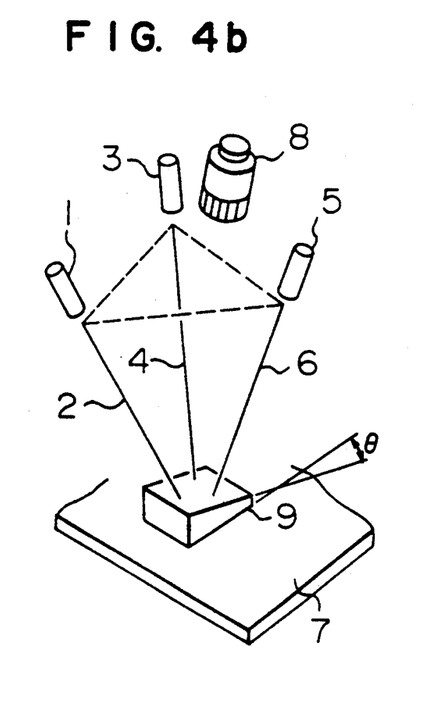
FIG. 4b is an explanatory view showing detection of an inclined angle of the electronic part in the second embodiment.
Figure 4C:
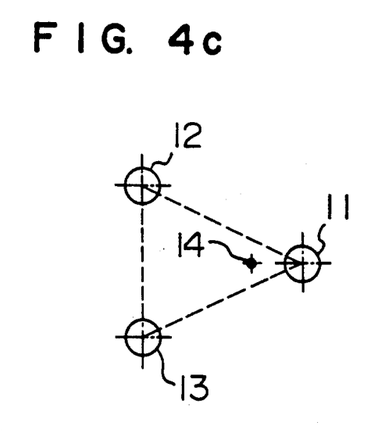
FIG. 4c is an explanatory view showing a condition of scattered light in the second embodiment.
Figure 4D:
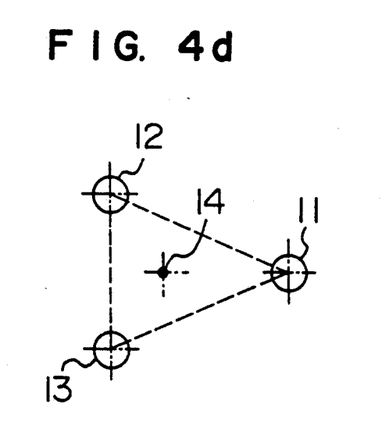
FIG. 4d is an explanatory view showing a condition of scattered light in the second embodiment.

In the case of inclination of the top surface of the electronic part 9 with respect to the printed circuit board 7, as shown FIGS. 4a to 4b, the light spots given by scattered light of the laser beams are shifted from the reference point 14 in accordance with the inclination angle e as shown in FIGS. 4c and 4d.

Thus, according to the second embodiment, the light spots visualized by scattered light of the red laser beam 2, the green laser beam and led laser beam 6 which are irradiated onto the top surface of the electronic part 9 are image-recognized by the color camera 8, thereby it is possible to calculate the height and the inclination angle of the top surface of the electronic part 9.

Figure 5A:
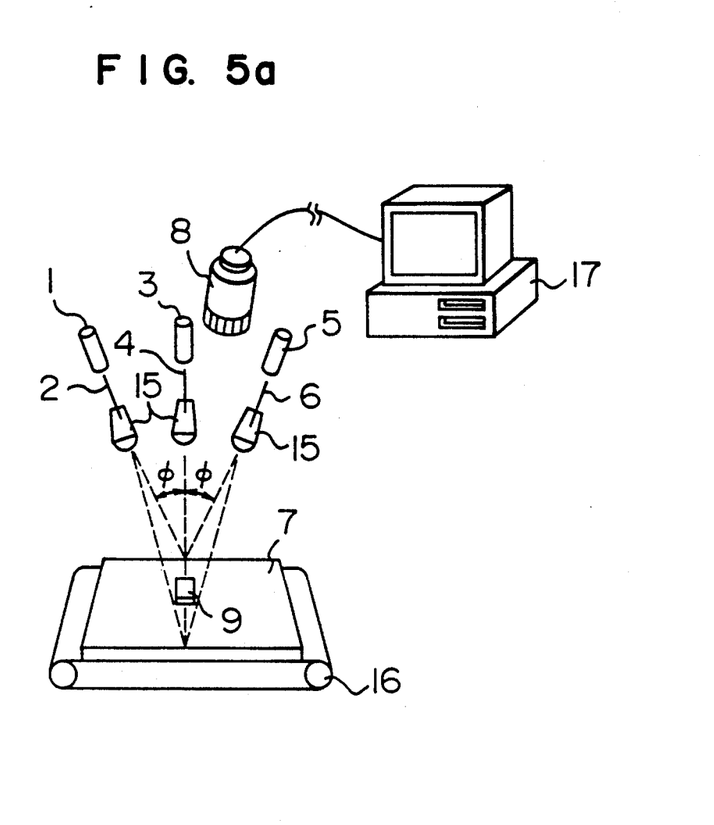
FIG. 5a is a schematic view illustrating an arrangement with which a circuit board visual inspection method in a third embodiment of the present invention is carried out.
Figure 5B:
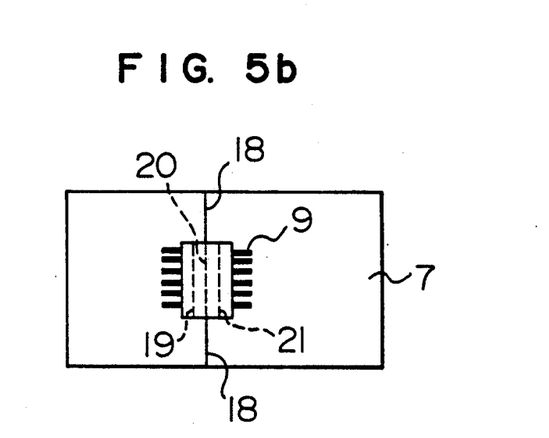
FIG. 5b is an explanatory view showing detection of a height of an electronic part mounted on a circuit board.

Next, explanation will be made hereinbelow a third embodiment of the present invention with reference to FIGS. 5a and 5b. In these figures, like references are used to denote like parts shown in the figures used in the explanation of the first embodiment, and accordingly, the detailed description thereof will be abbreviated. Each of the spot-like laser beams is converted into a line spot-like light beam by a cylindrical lens 15. Further, the printed circuit board 7 is conveyed in a predetermined direction by a conveyer 16. An image signal from the color TV camera 8 is processed by a control section 17 by which the images of the light spots can be displayed. The laser beams are converged onto a white line spot 18 on the printed circuit board 7, and are then irradiated on the top surface of the electronic part 9 as red, green and blue line light spots 19, 20, 21.

Next, explanation will be hereinbelow made of the detection method in the third embodiment of the present invention. The laser light sources are arranged so that the laser beams are converted, by cylindrical lens or the like, into line spot-like beams and are then converged to the single line light spot on the surface of the printed circuit board 7 with predetermined incident angles. Then the printed circuit board 7 is conveyed by the conveyer 16, and accordingly, the laser beams are irradiated onto the top surface of the electronic part 9. Accordingly, line light spots are obtained thereon, and scattered light therefrom is picked up by the color TV camera 8 so that image recognition is made therefor. Then, the distances between the line spots 20 and 19, and between the line spots 19 and 21 are measured so as to compute the height and inclined angle of the electronic part 9, as is similar to the first embodiment.

Next, explanation will be hereinbelow made of a fourth embodiment of the present invention with reference to FIGS. 6a to 6d. In these figures, like reference numerals are used to denote like parts as shown in the figures explained in the third embodiment, and detailed description thereof is abbreviated.

Figure 6A:
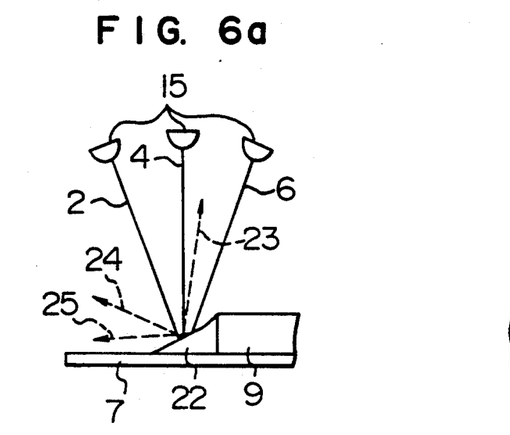
FIG. 6a is a schematic view illustrating an arrangement with which detection of a configuration of a part of an electronic part is carried out in a fourth embodiment of the present invention.
Figure 6B:
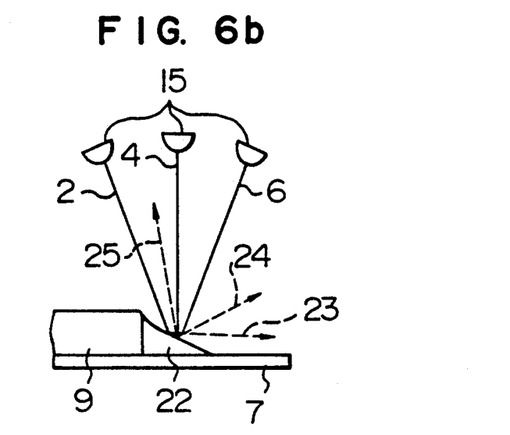
FIG. 6b is an explanatory view showing detection of the configuration in the fourth embodiment.

The laser beams are irradiated onto the upper surface of a solder filler 22 with which the electronic part 9 is coupled to the printed circuit board 7. No scattered light is substantially obtained from the upper surface of the solder fillet 22 since the laser beams are subjected to mirror-surface reflection. Mirror surface reflection light beams 23, 24, 15 are obtained by the laser beams 2, 4, 6 which are irradiated onto the solder fillet after they are converted into line spot-like light beams by the cylindrical lenses 15.

Figure 6C:
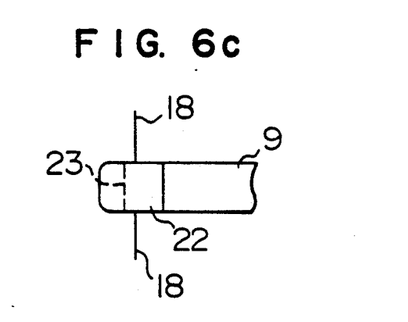
FIG. 6c is an explanatory view showing a condition of mirror-surface reflection light in the fourth embodiment.
Figure 6D:
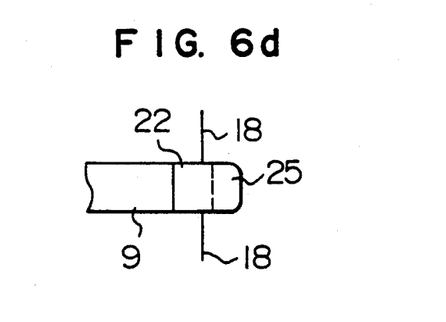
FIG. 6d is an explanatory view showing a condition of mirror-surface reflection light in the fourth embodiment.

Next, explanation will be made hereinbelow of the detection method in the fourth embodiment of the present invention. The laser light sources are arranged, similar to the third embodiment, such that the laser beams are converted, by means of cylindrical lenses, into line spot-like laser beams which are then converged to a line light spot on the surface of the printed circuit board 7, with predetermined incident angles. Then, the line spot-like laser beams are irradiated onto the upper surface of the solder filler 22, and as a result, the red, green and blue laser beams 2, 4, 6 are reflected thereby, and at least one of them is detected by the camera 8. It is noted that the blue laser beam 6 ss reflected as a beam 23 while the blue leaser beam 6 is reflected as a beam 25. With the image recognition by the camera 8 arranged above the printed circuit board 7, the conditions shown in FIGS. 6c and 6d are obtained. That is, the reflected light beams 23, 25 are detected at positions which are shifted, by certain distances, from the position of the white light spot 18 on the surface of the printed circuit board to which the laser beams are converged.

Thus, according to the above-mentioned fourth embodiment, the red, green and blue laser beams irradiated onto the upper surface of the solder fillet 22 are subjected to mirror-surface reflection. Then, the mirror-surface reflected laser beams are subjected to the image recognition by the camera 8. In view of the kinds of the laser beams which can be recognized by the camera and the shift values of the positions of the laser beam spots, the configuration or the inclined surface of the fillet 22 and the like can be detected with no contact condition.

Although it has been explained in the above-mentioned first to fourth embodiments that the incident angles of the laser beams are fixed respectively to predetermined angles, the red, green and blue lights can be automatically displaced by certain means so as to change the incident angles thereof in accordance with a shape of an electronic part 9 or a shape of the solder fillet 22, thereby it is possible to carry out the circuit board visual inspection method with a high degree of accuracy.

Further, in the fourth embodiment, although it has been explained that the camera 8 is stationary at a fixed position, the camera 8 can be automatically moved by a certain means. Accordingly, the camera is shifted in accordance with the configuration of the solder fillet 22 so as to detect the leaser beams under mirror-surface reflection over a wider range, thereby it is possible to carry out the circuit board visual inspection method with a high degree of accuracy.

What is claimed is:

1. A method of inspecting a circuit board on which an electronic part is mounted, comprising the steps of:
   directing three light beams having different colors from light sources onto a surface of a circuit board to be inspected at predetermined incident angles so that they are converged to a single light spot;
   irradiating said three light beams onto an electronic part mounted on said circuit board;
   measuring distances of positions on said electronic part to which said three light beams are irradiated respectively, from said single light spot on the surface of said circuit board; and
   computing a height and an inclined angle of said electronic parts in accordance with relationship between said measured distances and said incident angles.

2. A method as set forth in claim 1, wherein said light sources are arranged along one straight line.

3. A method as set forth in claim 2, wherein said three light beams are irradiated in a line spot-like shape.

4. A method as set forth in claim 1, wherein said light beams are irradiated in a spot-like shape.

5. A method as set forth in claim 1, wherein said light sources are arranged at apices of a triangle.

6. A method of inspecting a circuit board on which as electronic part is mounted, comprising the steps of:
   directing three light beams having different colors from light sources onto a surface of a circuit board to be inspected at predetermined incident angles so that they are converged to a single light spot;
   irradiating said three light beams onto a surface of a solder filler part of an electronic part mounted on said circuit board;
   measuring distances of positions on the surface of said fillet solder part to which said three light beams are irradiated respectively, from said single light spot on the surface of said circuit board; and
   computing a configuration of the surface of said solder fillet part in accordance relationship between said measured distances and said incident angles.

* * * * *